United States Patent
Wong

(10) Patent No.: US 7,895,491 B2
(45) Date of Patent: Feb. 22, 2011

(54) INTEGRATED CIRCUIT WITH LOW-POWER BUILT-IN SELF-TEST LOGIC

(75) Inventor: Yuqian C. Wong, San Diego, CA (US)

(73) Assignee: Broadcom Corp.

( * ) Notice: Subject to any disclaimer, the term of this patent is extended or adjusted under 35 U.S.C. 154(b) by 244 days.

(21) Appl. No.: 11/418,588

(22) Filed: May 4, 2006

(65) Prior Publication Data

US 2007/0260954 A1    Nov. 8, 2007

(51) Int. Cl.
*G01R 31/28* (2006.01)
*G06F 11/00* (2006.01)

(52) U.S. Cl. .................. 714/733; 714/726; 714/727; 714/729; 714/738

(58) Field of Classification Search .................. None
See application file for complete search history.

(56) References Cited

U.S. PATENT DOCUMENTS

| | | | | |
|---|---|---|---|---|
| 5,561,614 A * | 10/1996 | Revilla et al. | ............... | 702/120 |
| 5,796,751 A * | 8/1998 | Kundu | ............... | 714/726 |
| 5,927,050 A * | 7/1999 | Houck et al. | ............... | 53/428 |
| 6,662,324 B1 * | 12/2003 | Motika et al. | ............... | 714/726 |
| 6,728,914 B2 * | 4/2004 | McCauley et al. | ............... | 714/726 |
| 6,816,990 B2 * | 11/2004 | Song et al. | ............... | 714/729 |
| 6,901,546 B2 * | 5/2005 | Chu et al. | ............... | 714/738 |
| 7,010,735 B2 * | 3/2006 | Motika et al. | ............... | 714/726 |
| 7,203,913 B2 * | 4/2007 | Ohta et al. | ............... | 716/4 |
| 7,313,739 B2 * | 12/2007 | Menon et al. | ............... | 714/718 |
| 2002/0078411 A1 * | 6/2002 | D'Abreu | ............... | 714/727 |
| 2003/0046643 A1 * | 3/2003 | Ohta et al. | ............... | 716/4 |
| 2003/0145263 A1 * | 7/2003 | Song et al. | ............... | 714/726 |
| 2004/0128596 A1 * | 7/2004 | Menon et al. | ............... | 714/724 |
| 2005/0138514 A1 * | 6/2005 | Burdine et al. | ............... | 714/733 |
| 2006/0195737 A1 * | 8/2006 | James | ............... | 714/726 |
| 2006/0236181 A1 * | 10/2006 | Kiryu | ............... | 714/733 |
| 2006/0282732 A1 * | 12/2006 | Kiryu | ............... | 714/738 |
| 2007/0050693 A1 * | 3/2007 | Kiryu | ............... | 714/733 |
| 2007/0164785 A1 * | 7/2007 | He | ............... | 326/41 |
| 2007/0220382 A1 * | 9/2007 | Lackey | ............... | 714/726 |

* cited by examiner

*Primary Examiner*—Jeffrey A Gaffin
*Assistant Examiner*—Guerrier Merant
(74) *Attorney, Agent, or Firm*—McAndrews, Held & Malloy, Ltd.

(57) ABSTRACT

An integrated circuit with low-power built-in self-test logic ("IC-LPBIST") is disclosed. The IC-LPBIST may include combinational logic and a loading circuit enabled to load a shift test pattern of data into the loading circuit without powering the combinational logic of the IC-LPBIST, wherein the shift test pattern of data is configured to test the combinational logic for logical faults.

10 Claims, 8 Drawing Sheets

INTEGRATED CIRCUIT WITH LOW-POWER BUILT-IN SELF-TEST LOGIC

BACKGROUND OF THE INVENTION

1. Field of the Invention

This invention generally relates to the field of integrated circuit testing, and in particular to systems and methods for self-testing an integrated circuit.

2. Description of the Related Art

An integrated circuit (also known as an "IC", "microchip", "silicon chip", "computer chip," or "chip") is a miniaturized electronic circuit that has been manufactured on a semiconductor substrate composed of, for example, silicon, gallium arsenide ("GaAs"), or other types of semiconductor materials. An IC is typically packaged in a hermetically sealed case or a non-hermetic plastic capsule, with leads extending from it for input, output, and power-supply connections, and for other connections that may be necessary when the IC is put to use.

The two main advantages of ICs over discrete circuits are cost and performance. The cost is low because ICs, with all their components, are typically printed as a unit by photolithography and not constructed a transistor at a time. At present, IC areas range from a few square millimeters ($mm^2$) to around 250 $mm^2$, with up to approximately one million transistors per square millimeter.

Generally, while the cost of designing and developing a complex IC may be high, when this cost is spread across typically millions of production units the individual IC cost is minimized significantly. Additionally, the performance of ICs is high because the small size allows short traces which in turn allows low power logic (such as CMOS) to be utilized at fast switching speeds.

ICs have consistently migrated to smaller feature sizes over the years, allowing more circuitry to be packed on each chip. As the feature size shrinks, almost everything improves because the cost and the power consumption go down and the speed of the IC goes up. Since these gains are apparent to the end user, there is fierce competition among the manufacturers to use finer geometries and thinner line widths in producing newer ICs.

Manufacturers also fiercely compete to produce reliable IC designs because their respective reputations depend upon the reliability of their ICs. As the line width within an integrated circuit chip continues to shrink, this reliability becomes more difficult to achieve. Therefore, an ongoing challenge for the IC manufacturers is to increase the number and density of transistors on an IC without sacrificing reliability or suffering decreasing chip yields due to malfunctioning parts.

In addition to the problems associated with shrinking feature sizes in ICs, another approach to increasing the complexity of an IC includes the System-on-a-Chip ("SOC") approach, which also raises testing problems. In this approach, components traditionally manufactured as separate ICs, to be wired together on a printed circuit board, are designed to occupy a single IC that contains memory, microprocessor(s), peripheral interfaces, Input/Output logic control, data converters, and other components, together defining the whole electronic system.

Unfortunately, this increased complexity comes at a cost because while these process technologies allow placing tens of millions of gates onto an IC, they create serious test problems as to test development time and test application time for testing the IC for process defects. One standard way for testing ICs involves using an external memory tester (such as, for example, an Automatic Test Equipment "ATE") at the manufacturing site. As an example, FIG. 1 shows a block diagram of an example of an implementation of a known IC test system 100 that may include an IC under test 102 in signal communication with an external memory tester 104 via signal paths 106. The signal paths 106 may be wires that are electrically connected to leads 108 of the IC under test 102. It is appreciated by those skilled in the art that as the complexity of the IC under test 102 increases it becomes more difficult to properly test the IC under test 102 with the external memory tester 104.

In operation, the external memory tester 104 supplies power and applies test patterns to the IC to detect faults. Unfortunately, external memory testers may only test a limited number of ICs at a time, and the test speed is typically limited by the external bus speed. Consequently, these approaches for testing are expensive in terms of time requirements and equipment costs.

Attempts to solve this problem includes design for test ("DFT") approaches such as, for example, scan-test design, Logic built-in self-test ("BIST" or "Logic BIST"), and other similar technologies. DFT is an approach for IC and printed circuit board manufacturers to realize significant economic savings. At the device level, it sometimes replaces the traditional functional testing role in which ICs are tested at their I/O for functional performance as shown in FIG. 1.

As a result, BIST units are now commonly incorporated into ICs and ATE is presently simplified to the extent that the only necessary functions are to supply power (and sometimes a clock signal) to the IC, and to monitor a single output signal from the chip. The on-chip BIST unit generates all the test patterns and asserts (or de-asserts) the output signal if the chip passes the functionality test. The BIST may be configured to run every time the chip is powered-on, or the BIST may be configured to run only when a test mode signal is asserted.

As an example, FIG. 2 shows a block diagram of an example of an implementation of a known DFT approach in a DFT enabled IC 200. The DFT enabled IC 200 may include an IC core 202, BIST logic 204, and a test module 206. The test module may be in signal communication with the BIST logic 204 via a signal path 208, which may be a test bus. The IC core 202 may be in signal communication with the BIST logic 204 via a plurality of signal paths 210. The IC core 202 is the die (i.e., the IC circuitry) designed into the IC and may include combinational logic (not shown) that is capable of receiving a capture test pattern of data from the test module 206. Examples of the IC circuitry may include a processor, controller, application specific integrated circuit ("ASIC"), digital signal processor, memory module, RF chip-set, SOC, or other types of devices. The BIST logic 204 may include a loading circuit (not shown) for loading a shift pattern from the test module 206.

In an example of operation, the test module 206 may be logic circuitry that is programmable for running a plurality of tests on the IC core 202 in order to detect any potential faults of the IC core 202. As such, the BIST logic 204 may operate according to some predetermined algorithm, controlled by the test module 206, to verify the functionality of the internal IC core 202.

In FIG. 3, a block diagram of an example of an implementation of a known DFT approach for the BIST logic of a DFT enabled IC 300 is shown. The DFT enabled IC 300 may include combinational logic 302 and a loading circuit 304. The combinational logic 304 is part of an IC core (not shown) of the DFT enabled IC 300 and the loading circuit 302 is part of the BIST logic of a DFT enabled IC 300. For simplicity, only three sequential elements 306, 308, and 310 are shown, but it is appreciated by those skilled in the art that the loading circuit 304 may include a plurality of sequential elements where the number of sequential elements is determined by the design of the combinational logic and testing algorithms. The sequential elements 306, 308, and 310 may be implemented as D-latch flip-flops having data ("D"), scan-in ("$S_i$") and scan-enable ("$S_e$") inputs, sequential output ("Q"), and a clock input ("CLK"). The combinational logic 302 may be in signal communication with first sequential element 306 via signal paths 312 and 314, the second sequential element 308 via signal paths 316 and 318, and the third sequential element 310 via signal paths 320 and 322.

In an example of operation, the loading circuit 304 receives a shift test pattern of data 324 via the scan-in input of the first sequential element 306 and the combinational logic 302 receives a capture test pattern of data 326. The loading circuit 304 shifts the shift test pattern of data 324 through the loading circuit 304 utilizing a scan enable signal 328 and clock signal 330. The loading circuit 304 then passes the loaded shift test pattern of data 324 to the combinational logic 302 via signal paths 314, 318, and 322, and, in response, receives a resulting logic test pattern of data from the combinational logic 302 via signal paths 312, 316, and 320.

Unfortunately, this approach consumes significant power and time because in the shift mode of operation the loading circuit is passing signals to the combinational logic 302 via signal paths 314, 318, and 322, which is resulting in the combinational logic 302 receiving the signals, processing them, and producing resulting signals that are sent to the loading circuit 304. Additionally, because the combinational logic 302 is operating on the unloaded signal produced by the loading circuit 304 while it is shifting, the combinational logic 302 will require time to settle before the loading circuit 304 may pass the fully loaded shift test pattern of data.

Therefore, there is a need for a system and method capable of testing complex ICs quickly and at low-power.

SUMMARY

An integrated circuit with low-power built-in self-test logic ("IC-LPBIST") is disclosed. The IC-LPBIST may include combinational logic and a loading circuit. The loading circuit may be enabled to load a shift test pattern of data into the loading circuit without powering the combinational logic of the IC-LPBIST. The shift test pattern of data may be configured to test the combinational logic for logical faults. As an example, the loading circuit may include a shift register and the shift register may include a plurality of sequential elements.

In an example of operation, the IC-LPBIST performs a process that may include loading a shift test pattern of data into a loading circuit without powering the combinational logic of the IC-LPBIST, loading a capture test pattern of data into the combinational logic, and capturing a resulting logic test pattern of data from the combinational logic in response to applying the loaded shift test pattern of data to the combinational logic.

Various advantages, aspects and novel features of the present invention, as well as details of an illustrated implementation thereof, will be more fully understood from the following description and drawings.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention may be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description, reference is made to the accompanying drawings that form a part hereof, and that show, by way of illustration, a specific implementation in which the invention may be practiced. Other examples of implementation may be utilized and structural changes may be made without departing from the scope of the present invention.

In general, an integrated circuit with low-power built-in self-test logic ("IC-LPBIST") is disclosed. The IC-LPBIST may include combinational logic and a loading circuit. The loading circuit may be enabled to load a shift test pattern of data into the loading circuit without powering the combinational logic of the IC-LPBIST.

Figure 1:
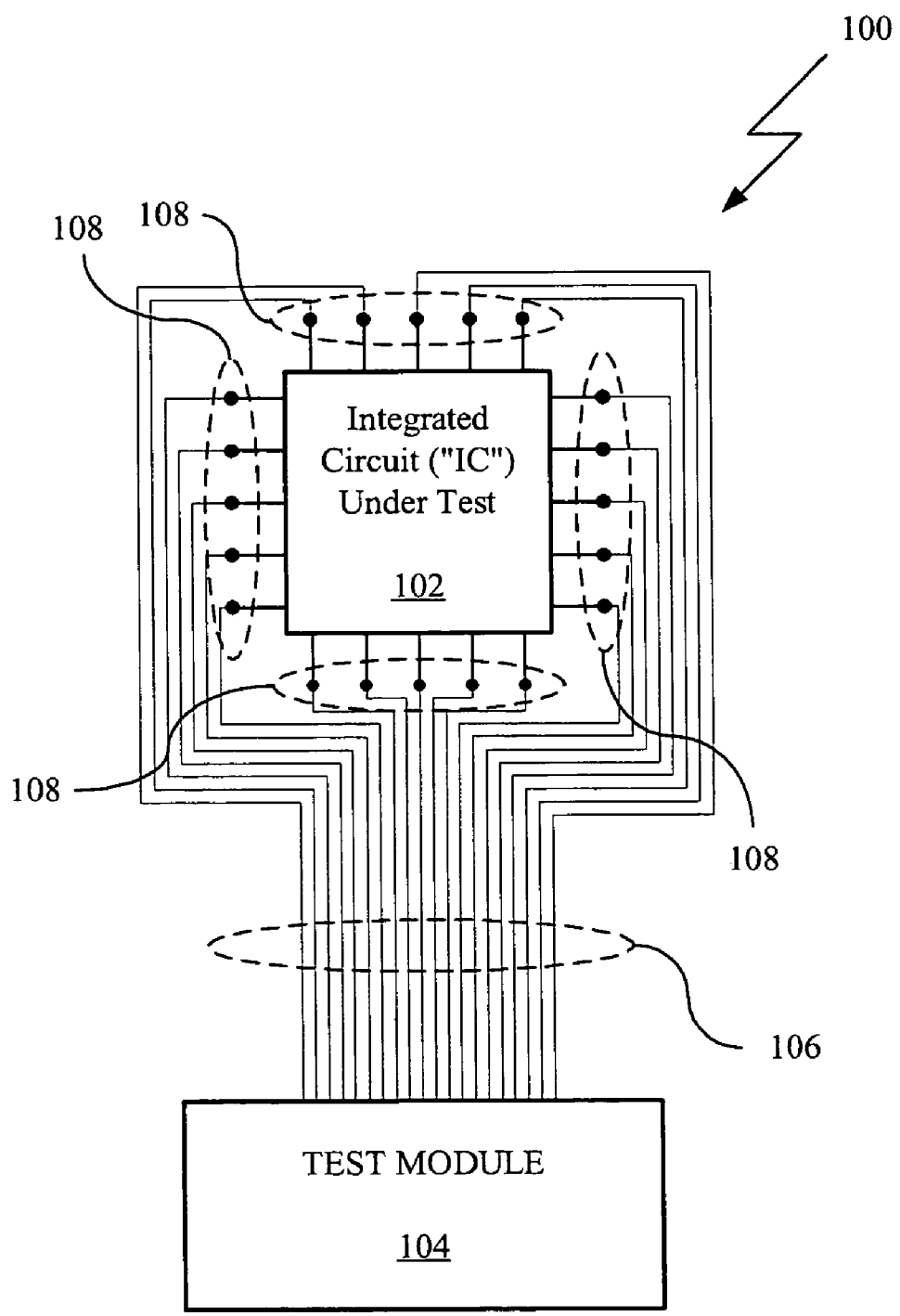
FIG. 1 is a block diagram of an example of an implementation of a known IC test system that may include an IC under test in signal communication with an external memory tester.
Figure 2:
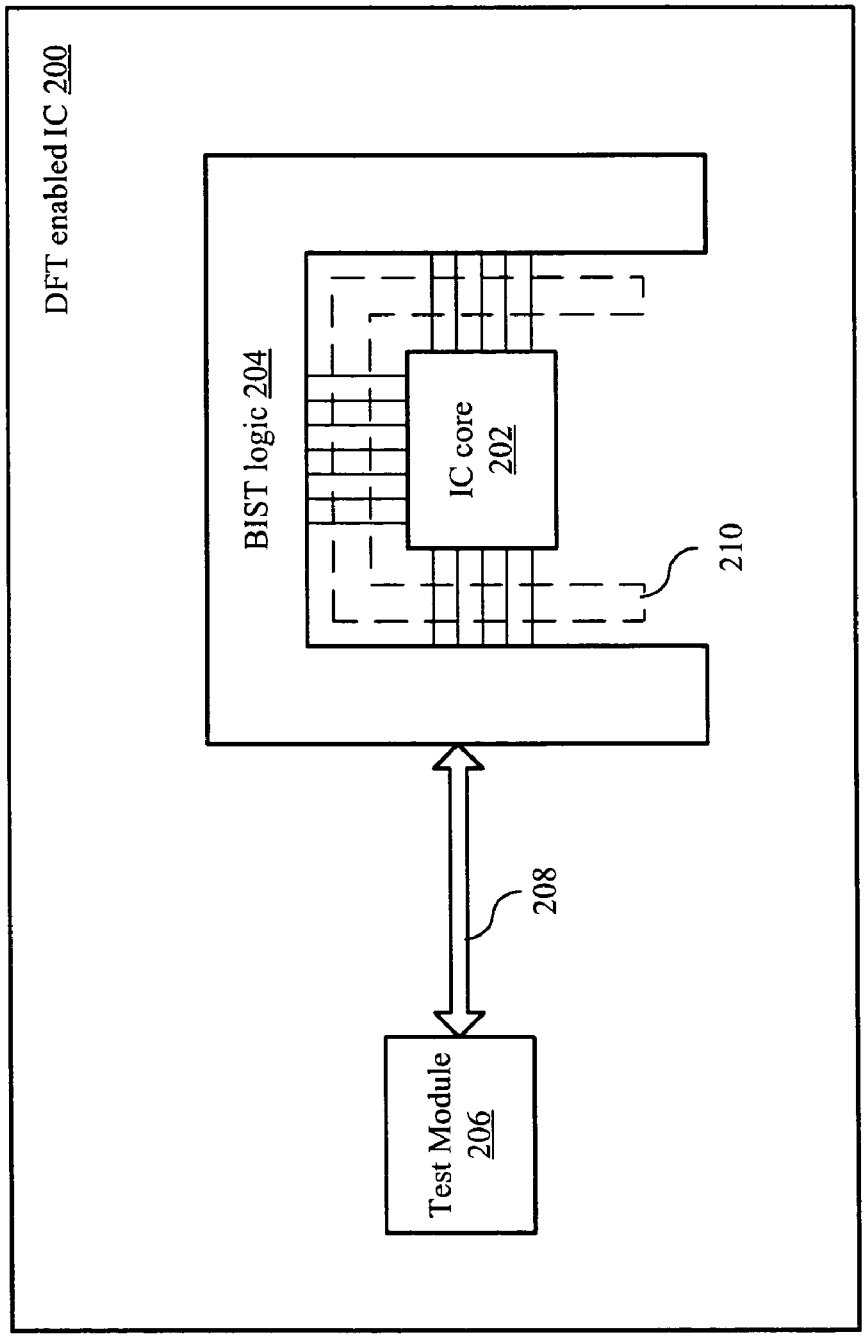
FIG. 2 is a block diagram of an example of an implementation of a known DFT approach in a DFT enabled IC.
Figure 3:
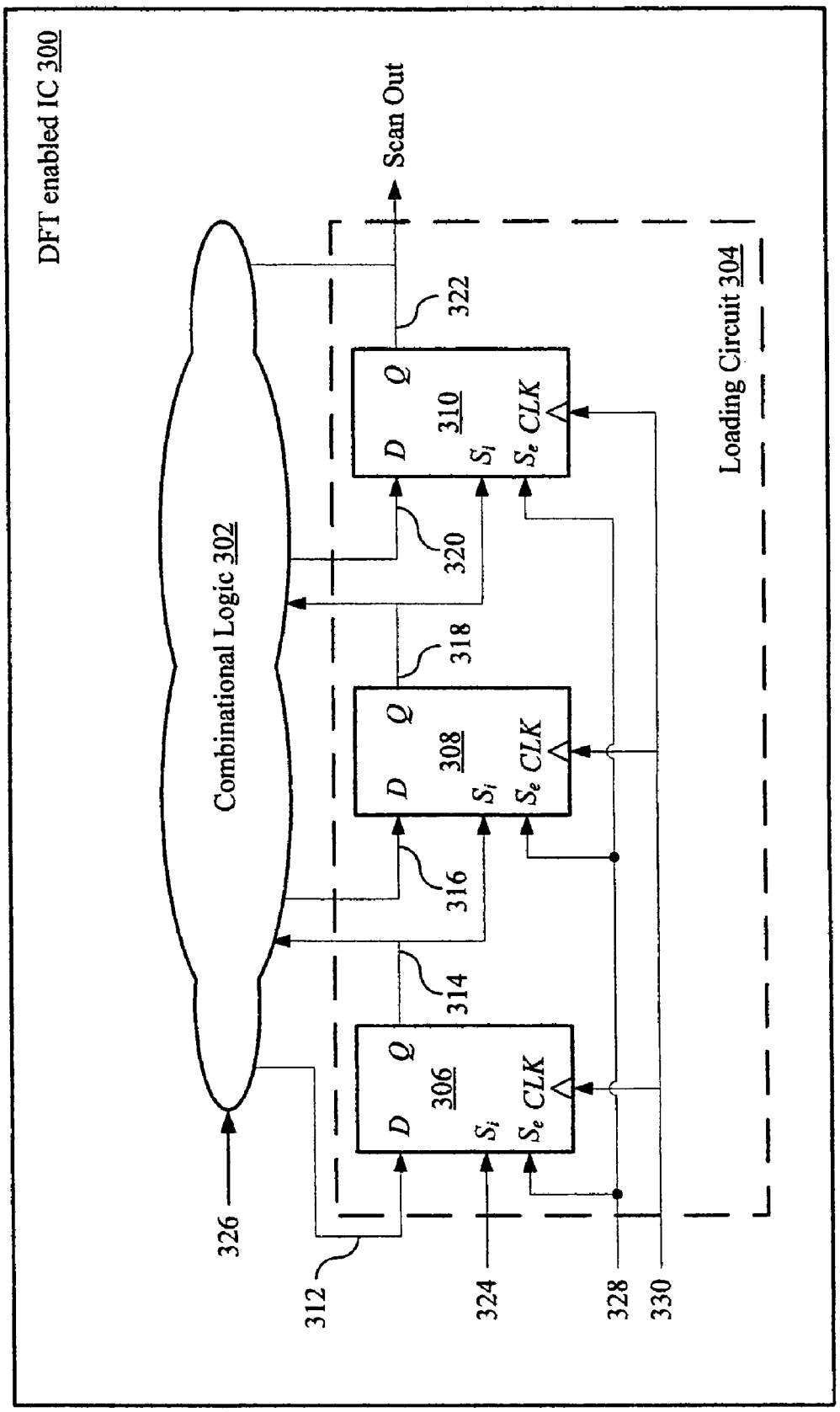
FIG. 3 is a block diagram of an example of an implementation of a known DFT approach for the BIST logic of a DFT enabled.
Figure 4:
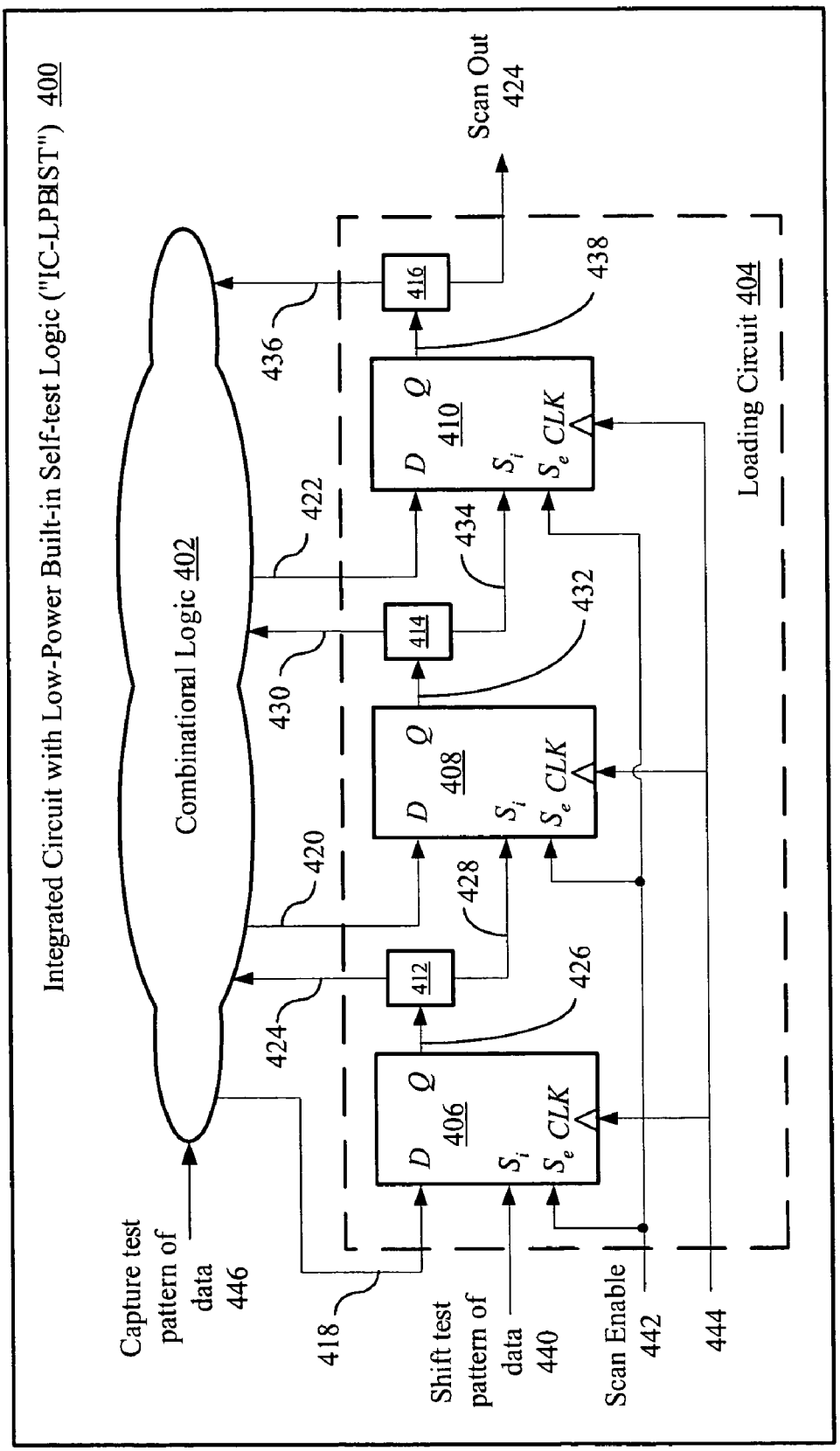
FIG. 4 is a block diagram of an example of an implementation of an integrated circuit with low-power built-in self-test logic ("IC-LPBIST").

In FIG. 4, a block diagram of an example of an implementation of an IC-LPBIST 400 is shown. The IC-LPBIST 400 may include combinational logic 402 and a loading circuit 404. The combinational logic 402 is part of an IC core (not shown) of the IC-LPBIST 400 and the loading circuit 402 is part of the BIST logic of the IC-LPBIST 400. The loading circuit 404 may include a shift register that may include a plurality of sequential elements and a plurality of switching elements for shifting a test pattern of data through the loading circuit 404. Similar to FIG. 3, for simplicity, only three sequential elements 406, 408, and 410 are shown but it is appreciated by those skilled in the art that the loading circuit 404 may include a plurality of sequential elements where the number of sequential elements is determined by the design of the combinational logic and testing algorithms. Similarly, the loading circuit 404 may include switching elements 412, 414, and 416. The sequential elements 406, 408, and 410 may be implemented as D-latch flip-flops having data ("D"), scan-in ("$S_i$") and scan-enable ("$S_e$") inputs, sequential output ("Q"), and a clock input ("CLK"). The combinational logic 402 may be in signal communication with first sequential element 406 via signal path 418, the second sequential element 408 via signal path 420, and the third sequential element 410 via signal path 422. Additionally, the first switching element 412 may be in signal communication with the combinational logic 402, the sequential output Q of the first sequential element 406, and the scan-in input $S_i$ of second sequential element 408 via signal paths 424, 426, and 428, respectively. Similarly, the second switching element 414 may be in signal communication with the combinational logic 402, the sequential output Q of the second sequential element 408, and the scan-in input $S_i$ of third sequential element 410 via signal paths 430, 432, and 434, respectively. Moreover, the third switching element 416 may be in signal communication with the combinational logic 402 and the sequential output Q of the third sequential element 410 via signal paths 436 and 438, respectively. As an example, the switching elements 414, 416, and 418 may include transistor and/or diode switches.

In an example of operation, the IC-LPBIST 400 performs a process that may include loading the shift test pattern of data 440 into a loading circuit 404 without powering the combinational logic 402, loading the capture test pattern of data 446 into the combinational logic 402, and capturing a resulting logic test pattern of data from the combinational logic 402 in response to applying the loaded shift test pattern of data 440 to the combinational logic 402.

The IC-LPBIST 400 may operate in a TEST mode that tests the combinational logic 402 for faults. In the TEST mode, the loading circuit 404 may operate in a SHIFT mode or a CAPTURE mode. Initially in the TEST mode, the loading circuit 404 receives a shift test pattern of data 440 via the scan-in input of the first sequential element 406. The switching elements 412, 414, and 416 are initially set to the SHIFT mode where the sequential outputs Q of the sequential elements 406, 408, and 410 are passed to the scan-in inputs $S_i$ of the next sequential element and not the combinational logic 402. In the SHIFT mode, the loading circuit 404 shifts the shift test pattern of data 440 through the loading circuit 404 utilizing a scan enable signal 442 and clock signal 444. As a result, in the SHIFT mode, the loading circuit 404 loads the shift test pattern of data 440 into the loading circuit 404 but does not provide power to the combinational logic 402 because the switching elements 412, 414, and 416 do not allow signals to be sent to the combinational logic 402 (i.e., the switching elements 412, 414, and 416 block the signals to the combinational logic 402). It is appreciated by those skilled in the art that the shift test pattern of data 440 may include a bit stream that is configured to test the combinational logic 402 for logical faults.

As an example, if the sequential elements 406, 408, and 410 are D-latch flip-flops, the loading circuit 404 shifts the shift test pattern of data 440 through the loading circuit 404 bit-by-bit by applying bit-by-bit the shift test pattern of data 440 to the scan-in input $S_i$ of the first sequential element 406 and then applying the shift pattern signal at the scan enable 442 input of each of flip-flops 406, 408, and 410 along with the corresponding clock signal 444. The process continues until the shift test pattern of data 440 is completely loaded into the plurality of flip-flops 406, 408, and 410.

Once the shift test pattern of data 440 is fully loaded into the loading circuitry 404, the switching elements 412, 414, and 416 are set to a CAPTURE mode where the sequential outputs Q of the sequential elements 406, 408, and 410 are passed to the combinational logic 402 via signal paths 426 and 424, 432 and 430, and 438 and 436, respectively. In the CAPTURE mode, the combinational logic 402 receives a capture test pattern of data 446 and the loading circuit 404 then passes the loaded shift test pattern of data 440 to the combinational logic 402 (via signal paths 426 and 424, 432 and 430, and 438 and 436) and, in response, receives a resulting logic test pattern of data from the combinational logic 402 via signal paths 418, 420, and 422. The loading circuit 404 then outputs the resulting logic test pattern of data via signal path 424 (generally known as "scan out").

Figure 5:
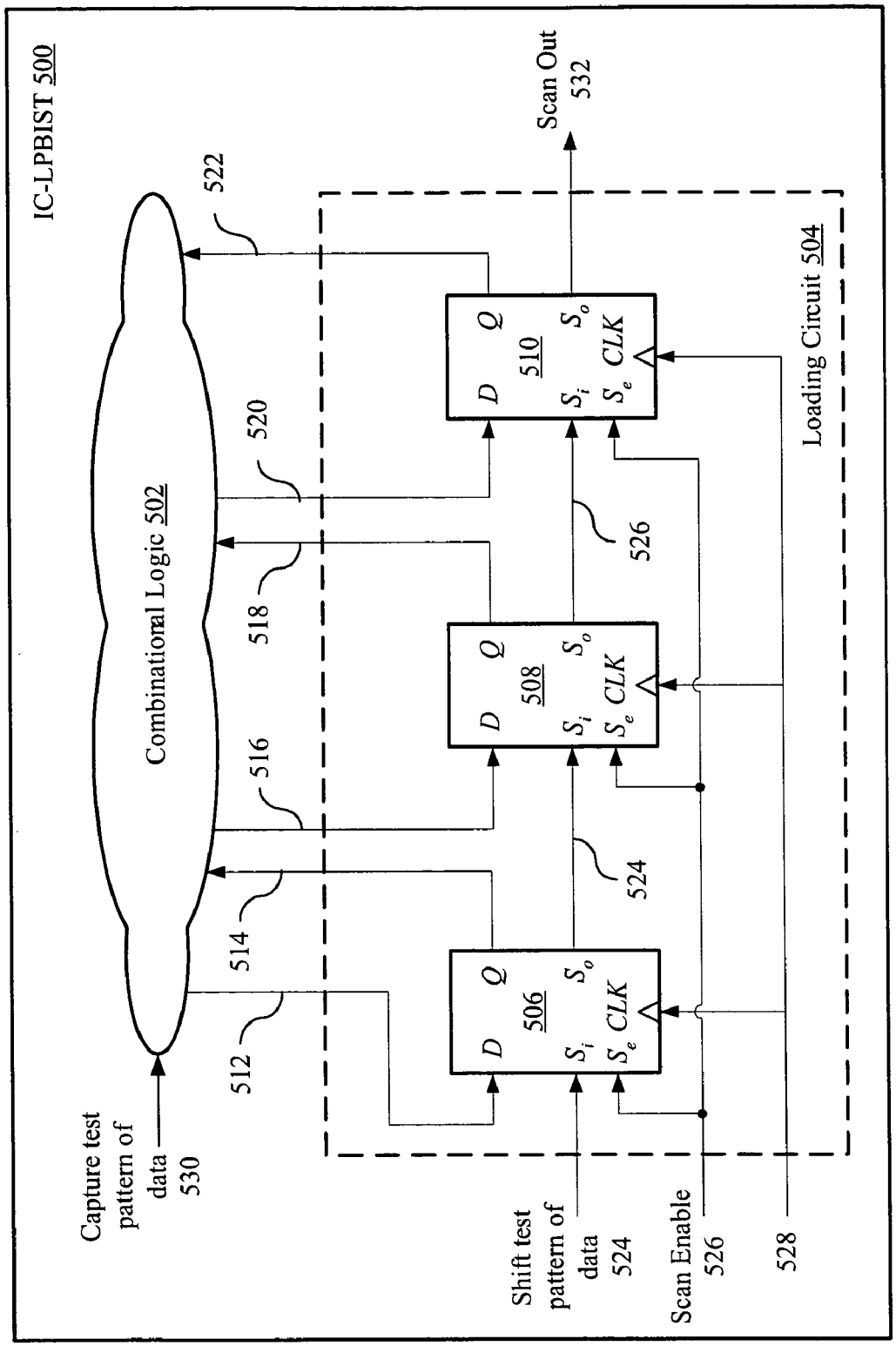
FIG. 5 is a block diagram of an example of another implementation of an IC-LPBIST.

In FIG. 5, a block diagram of an example of another implementation of an IC-LPBIST 500 is shown. Similarly to FIG. 4, the IC-LPBIST 500 may include combinational logic 502 and a loading circuit 504. The combinational logic 502 is part of an IC core (not shown) of the IC-LPBIST 500 and the loading circuit 504 is part of the BIST logic of the IC-LPBIST 500. The loading circuit 504 may include a shift register that may include a plurality of sequential elements and a plurality of switching elements for shifting a test pattern of data through the loading circuit 504. Similarly to FIGS. 3 and 4, for simplicity, only three sequential elements 506, 508, and 510 are shown but it is appreciated by those skilled in the art that the loading circuit 504 may include a plurality of sequential elements where the number of sequential elements is determined by the design of the combinational logic and testing algorithms. As an example, the sequential elements 506, 508, and 510 may be implemented as modified D-latch flip-flops having data D, scan-in $S_i$ and scan-enable $S_e$ inputs, sequential output Q, scan-out $S_o$ output, and a clock input CLK. The combinational logic 502 may be in signal communication with first sequential element 506 via signal paths 512 and 514, the second sequential element 508 via signal paths 516 and 518, and the third sequential element 510 via signal paths 520 and 522. Additionally, the first sequential element 510 may be in signal communication with the scan-in $S_i$ input of the second sequential element 508, via signal path 524, and the second sequential element 508 may be in signal communication with the scan-in $S_i$ input of the third sequential element 510, via signal path 526.

Similarly to FIG. 4, in an example of operation, the IC-LPBIST 500 may operate in a TEST mode that tests the combinational logic 502 for faults. In the TEST mode, the loading circuit 504 may operate in a SHIFT mode or a CAPTURE mode. Initially in the TEST mode, the loading circuit 504 is in a SHIFT mode where the loading circuit 504 receives a shift test pattern of data 524 via the scan-in input of the first sequential element 506. In the SHIFT mode, the sequential outputs Q of the sequential elements 506, 508, and 510 are disabled and no signals are passed to the combinational logic 502 and the scan-out $S_o$ output is passed the scan-in $S_i$ input of the next sequential element. Additionally in the SHIFT mode, the loading circuit 504 shifts the shift test pattern of data 524 through the loading circuit 504 utilizing a scan enable signal 526 and clock signal 528. As a result, in the SHIFT mode, the loading circuit 504 loads the shift test pattern of data 524 into the loading circuitry 504 but does not provide power to the combinational logic 502 because the sequential outputs Q of the sequential elements 506, 508, and 510 are disabled and therefore no signals are sent to the combinational logic 502. Again, it is appreciated that the shift test pattern of data 524 may include a bit stream that is configured to test the combinational logic 502 for logical faults.

As an example, if the sequential elements 506, 508, and 510 are modified D-latch flip-flops, the loading circuit 504 shifts the shift test pattern of data 524 through the loading circuit 504 bit-by-bit by applying bit-by-bit the shift test pattern of data 524 to the scan-in input $S_i$ of the first sequential element 506 and then applying the shift pattern signal at the scan enable 526 input of each of flip-flops 506, 508, and 510 along with the corresponding clock signal 528. The shift test pattern of data 524 is passed from the scan-out $S_o$ output of the first sequential element 506 to the scan-in $S_i$ input of the second sequential element 506 via signal path 524. Similarly, the shift test pattern of data 524 is passed from the scan-out $S_o$ output of the second sequential element 508 to the scan-in $S_i$ input of the third sequential element 510 via signal path 526. The process continues until the shift test pattern of data 524 is completely loaded into the plurality of flip-flops 506, 508, and 510.

Once the shift test pattern of data 524 is fully loaded into the loading circuitry 504, the loading circuit 504 is set to CAPTURE mode where the sequential outputs Q of the sequential elements 506, 508, and 510 are activated to path signals to the combinational logic 502 via signal paths 514, 518, and 522, respectively. In the CAPTURE mode, the combinational logic 502 receives a capture test pattern of data 530 and the loading circuit 504 then passes the loaded shift test pattern of data 524 to the combinational logic 502 (via signal paths 514, 518, and 522) and, in response, receives a resulting logic test pattern of data from the combinational logic 502 via signal paths 512, 516, and 520. The loading circuit 504 then outputs the resulting logic test pattern of data via signal path 532 (generally known as "scan out").

Figure 6:
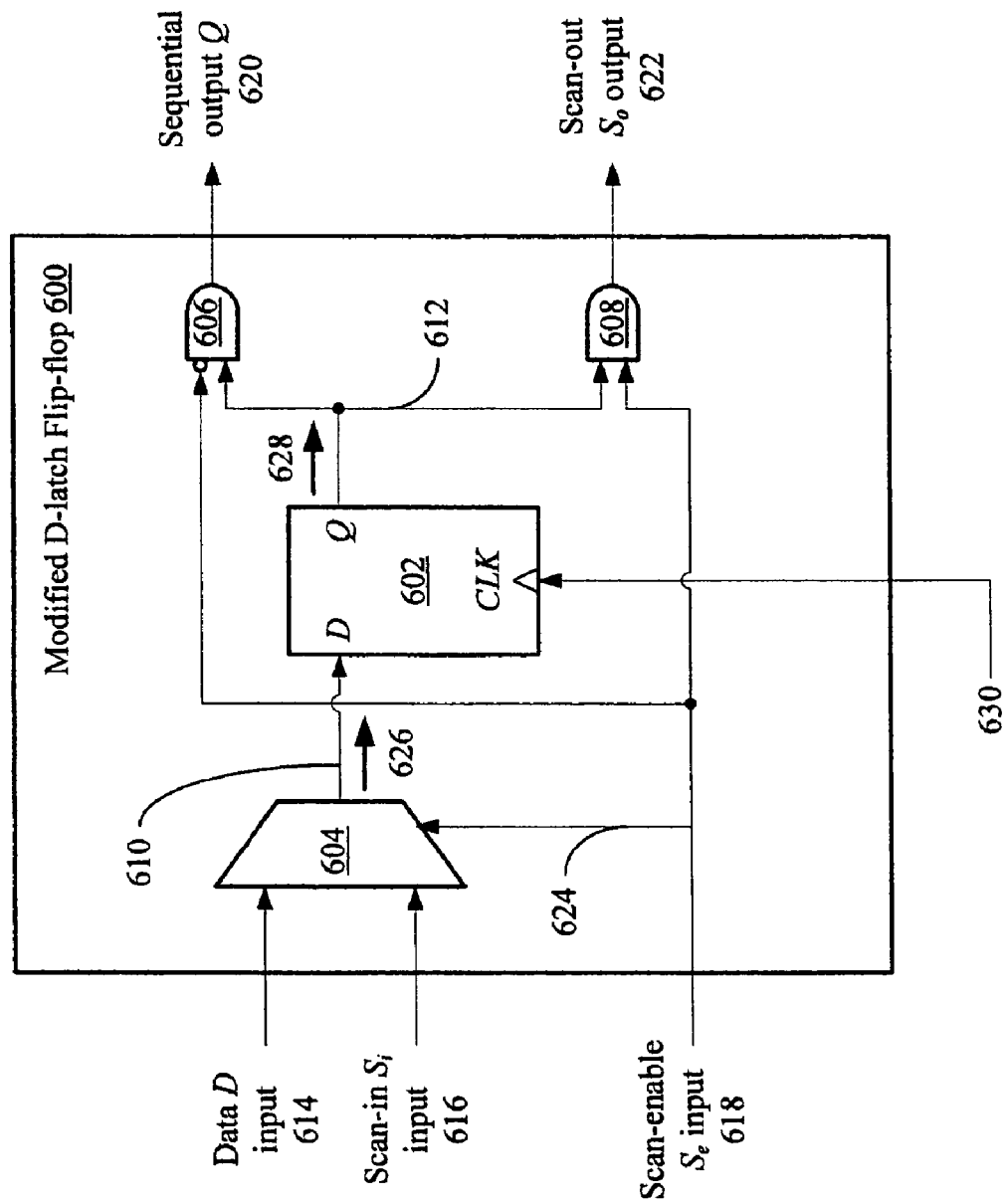
FIG. 6 is a block diagram of an example of an implementation of a modified D-latch flip-flop shown in FIG. 5.

In FIG. 6, a block diagram of an example of an implementation of a modified D-latch flip-flop 600 of FIG. 5 is shown. The modified D-latch flip-flop 600 may include a D-latch flip-flop 602 and multiplexer 604, a first AND gate 606, and second AND gate 608. The D-latch flip-flop 602 may be in signal communication with the multiplexer 604, first AND gate 606, and second AND gate 608 via signal paths 610 and 612, respectively.

The modified D-latch flip-flop 600 may include three inputs and two outputs. The three inputs may include a data D input 614, a scan-in $S_i$ input 616, and a scan-enable $S_e$ input 618. The two outputs may be a sequential output Q 620 and a scan-out $S_o$ output 622. The data D input 614 and scan-in $S_i$ input 616 may be inputs to the multiplexer 604 and the output of the multiplexer 604 may be passed to the data D input of the D-latch flip-flop 602. The scan-enable $S_e$ input 618 may be input into the multiplexer 604, first AND gate 606 (after being inverted), and second AND gate 608 via signal path 624.

In an example of operation, the data D input 614 and scan-in $S_i$ input 616 are multiplexed together by the multiplexer 604 to produce a multiplex input D signal 626 that is passed to the data D input of the D-latch flip-flop 602 when the scan-enable $S_e$ input 618 is high. The D-latch flip-flop 602 then produces a sequential output Q 628, when the clock signal 630 is high, that is passed to the first AND gate 606 and second AND gate 608 via signal path 612. The first AND gate 606 performs a logically AND on the inverse of the scan-enable $S_e$ input 618 and the sequential output Q 628 to produce the sequential output Q 620. Similarly, the second AND gate 608 performs a logically AND on the scan-enable $S_e$ input 618 and the sequential output Q 628 to produce the scan-out $S_o$ output 622. The relationship of the scan-enable $S_e$ input 618, sequential output Q 620, and scan-out $S_o$ output 622 signals is shown in FIG. 7.

Figure 7:
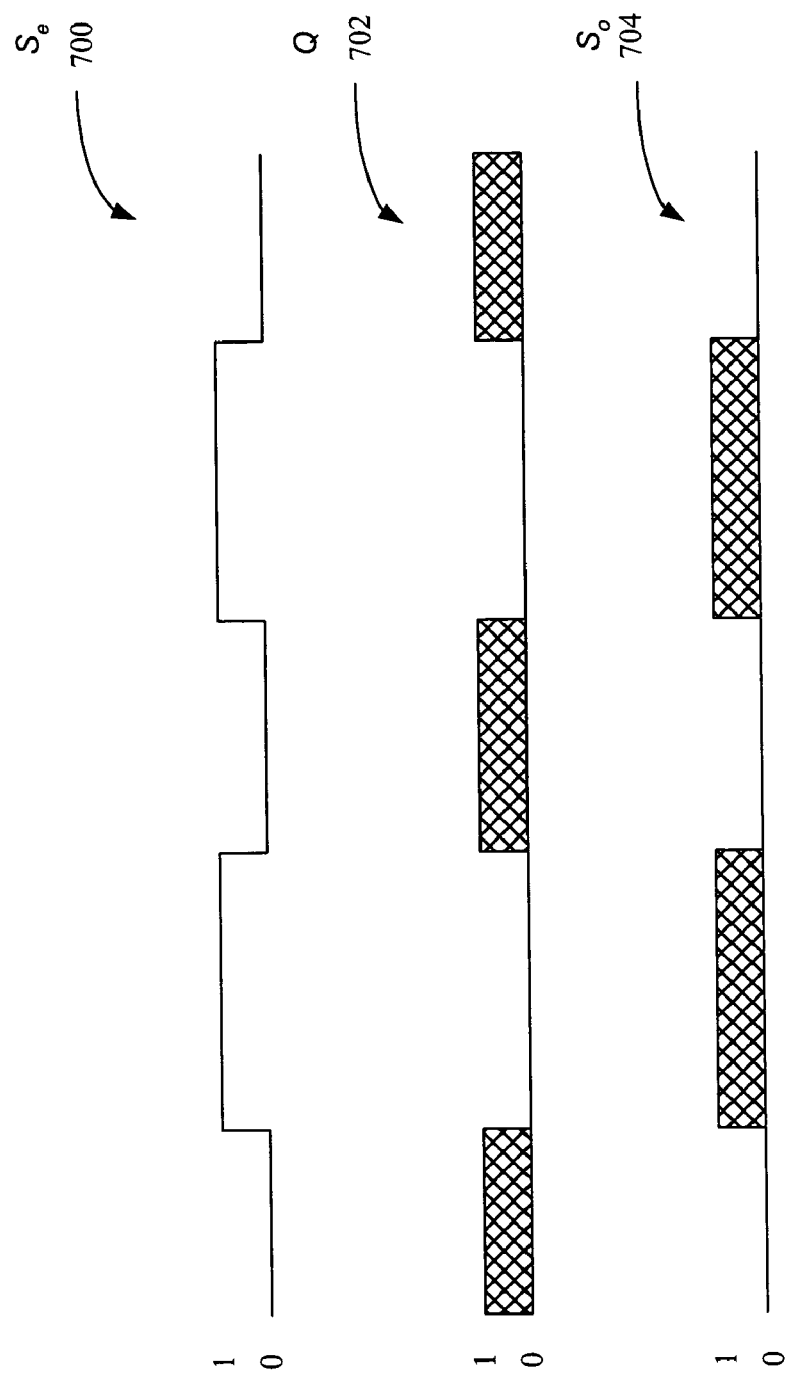
FIG. 7 is a signal timing diagram of the plots of the scan-enable $S_e$ input, sequential output Q, and scan-out $S_o$ output signals shown in FIG. 6.

In FIG. 7, a signal timing diagram of the plots of scan-enable $S_e$ input 700, sequential output Q 702, and scan-out $S_o$ output 704 signals is shown. The plots represent the state of the modified D-latch flip-flop 600 shown in FIG. 6. As an example in FIG. 6, the scan-enable $S_e$ input 618 signal is passed, via signal path 624, to both logical AND gates 606 and 608; however, the input into the first logical AND gate 606 is inverted. In FIG. 7, an example timing plot of the scan-enable $S_e$ input 618 signal is illustrated by the scan-enable $S_e$ input 700 signal plot. Similarly, the sequential output Q 702 signal plot is a timing plot of an illustration of the sequential output Q 628, FIG. 6, and scan-out $S_o$ output 704, FIG. 7, signal plot is a timing plot of an illustration of the scan-out $S_o$ output 622. From the plots 700, 702, and 704, it is appreciated that the scan-enable $S_e$ input 700 controls the outputs from the modified D-latch flip-flop 600. In this example, when the scan-enable $S_e$ input 700 signal is in a LOW state (i.e., has a logical "0" value), the scan-out $S_o$ output 704 signal is in a LOW state while the sequential output Q 702 signal is in a HIGH state (i.e., has a logical "1" value). Alternatively, when the scan-enable $S_e$ input 700 signal is in a HIGH state, the scan-out $S_o$ output 704 signal is in a HIGH state while the sequential output Q 702 signal is in a LOW state. Typically, the HIGH state is also known as a "SWITCHING" state because the output of the modified D-latch flip-flop 600 is in switching based on the state of the modified D-latch flip-flop 600.

Figure 8:
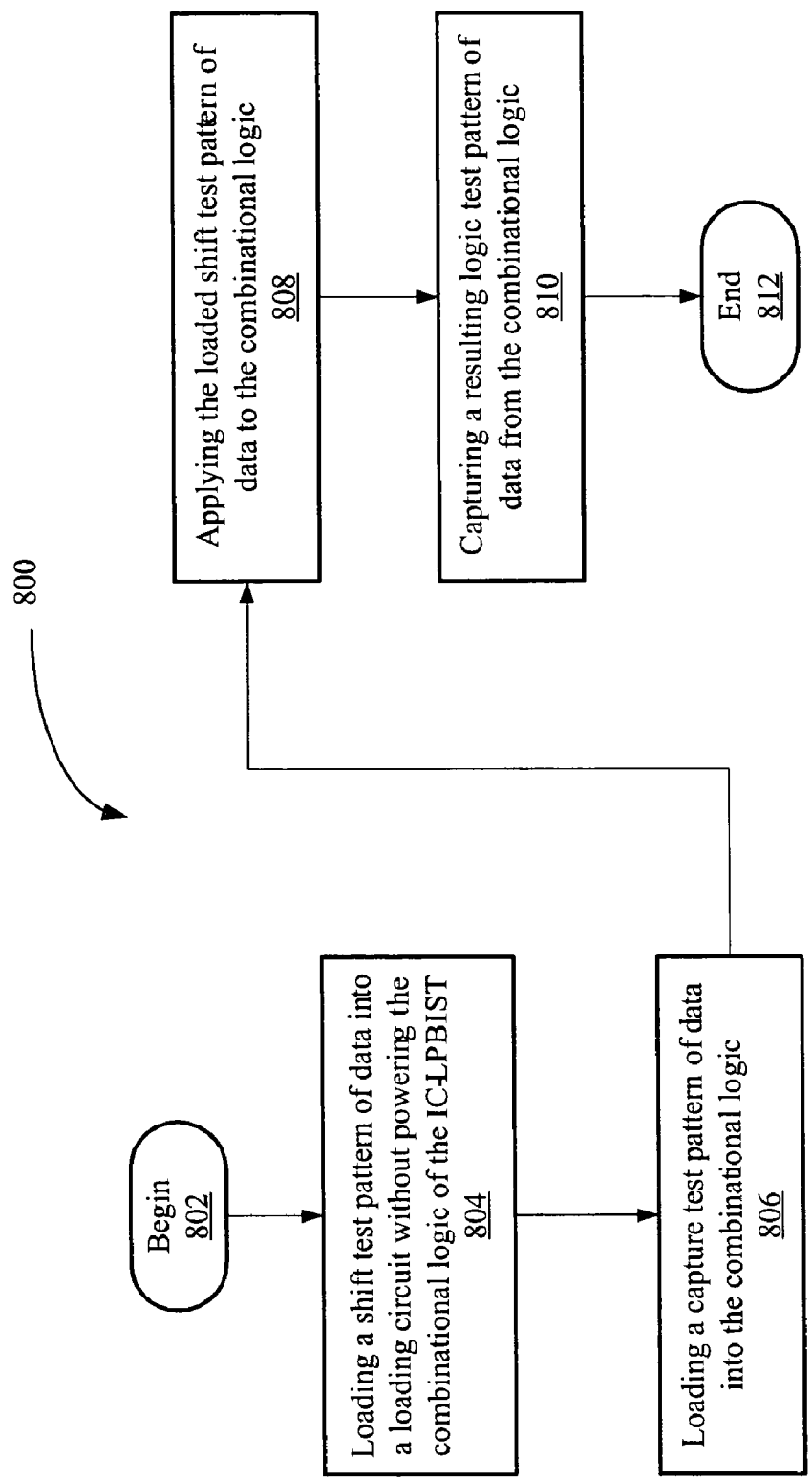
FIG. 8 is a flow diagram of an example of a process performed by the IC-LPBIST shown in FIGS. 4 and 5.

In FIG. 8, a flow diagram 800 of an example of a process performed by the IC-LPBIST of FIGS. 4 and 5 is shown. The process begins in step 802 and in step 804, a loading circuit loads a shift test pattern of data into the loading circuit without powering the combinational logic of the IC-LPBIST. In step 806, a capture test pattern of data is loaded into the combinational logic. In step 808, the loading circuit applies the loaded shift test pattern of data to the combinational logic and in step 810 the resulting logic test pattern of data from the combinational logic is captured by the loading circuit. The process then ends in step 812.

Persons skilled in the art will understand and appreciate, that one or more processes, sub-processes, or process steps described may be performed by hardware or software, or both. Additionally, the invention may be implemented completely in software that would be executed within a microprocessor, general-purpose processor, combination of processors, DSP, or ASIC. The invention may be realized in a centralized fashion in at least one computer system, or in a distributed fashion where different elements are spread across several interconnected computer systems. If the process is performed by software, the software may reside in instruction memory in the processor. The software in instruction memory may include an ordered listing of executable instructions for implementing logical functions (i.e., "logic" that may be implemented either in digital form such as digital circuitry or source code or in analog form such as analog circuitry or an analog source such an analog electrical, sound or video signal), and may selectively be embodied in any computer-readable (or signal-bearing) medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "machine-readable medium", "computer-readable medium" or "signal-bearing medium" is any means that may contain, store, communicate, propagate, or transport the program for use by or in connection with the instruction execution system, apparatus, or device. The computer readable medium may selectively be, for example but not limited to, an electronic, magnetic, optical, electromagnetic, infrared, or semiconductor system, apparatus, device, or propagation medium. More specific examples, but nonetheless a non-exhaustive list, of computer-readable media would include the following: an electrical connection (electronic) having one or more wires; a portable computer diskette (magnetic); a RAM (electronic); a read-only memory "ROM" (electronic); an erasable programmable read-only memory (EPROM or Flash memory) (electronic); an optical fiber (optical); and a portable compact disc read-only memory "CDROM" (optical). Note that the computer-readable medium may even be paper or another suitable medium upon which the program is printed, as the program can be electronically captured, via, for instance, optical scanning of the paper or other medium, then compiled, interpreted or otherwise processed in a suitable manner if necessary, and then stored in a computer memory.

While the present invention has been described with reference to certain embodiments, it will be understood by those skilled in the art that various changes can be made and equivalents can be substituted without departing from the scope of the present invention. It will be understood that the foregoing description of an implementation has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed:

1. An integrated circuit with low-power built-in self-test logic, the integrated circuit comprising:
   combinational logic; and
   a loading circuit operable to load a shift test pattern of data into the loading circuit without applying said data to the combinational logic of the integrated circuit, wherein the shift test pattern of data is configured to test the combinational logic for logical faults, the loading circuit comprising:
      a shift register comprising a plurality of flip-flops, each flip-flop comprising a data input, a scan-in input, a scan enable input and a sequential output, wherein the loading circuit is operable to receive the shift test pattern of data bit-by-bit at the scan-in input of a first flip-flop of the plurality of flip-flops and to receive a series of shift pattern signals at the scan enable input of each flip-flop of the plurality of flip-flops; and
      a plurality of switching elements, each receiving a sequential output of one of the plurality of flip-flops, each switching element selectably coupling the received sequential output to one of the combinational logic and a scan-in input of a next of the plurality of flip-flops.

2. The integrated circuit of claim 1,
   wherein the integrated circuit is enabled to operate in a TEST mode, wherein the TEST mode includes a SHIFT mode and a CAPTURE mode for the loading circuit, and
   wherein the loading circuit is enabled to loading a shift test pattern of data into the loading circuit in the SHIFT mode without passing power to the combinational logic,
   wherein the loading circuit is enabled to pass a sequential output of each flip-flop to the combinational logic in the CAPTURE mode, and
   wherein the CAPTURE mode is initiated when the shift test pattern of data is fully loaded into the loading circuit.

3. The integrated circuit of claim 2, further including a plurality of switching elements within the loading circuit, wherein the plurality of switching elements are in signal communication with the plurality of flip-flops and the combinational logic.

4. The integrated circuit of claim 1 wherein when the switching elements are in a shift mode, the switching elements couple their received sequential outputs to the scan-in input of the next of the plurality of flip-flops, whereby said shift pattern signals cause the shift test pattern to shift through the plurality of flip-flops until the shift test pattern of data is completely loaded into the plurality of flip-flops.

5. The integrated circuit of claim 1 wherein when the switching elements are in a shift mode, the switching elements couple their received sequential outputs to the scan-in input of the next of the plurality of flip-flops, whereby said shift pattern signals cause the shift test pattern to shift through the plurality of flip-flops until the shift test pattern of data is completely loaded into the plurality of flip-flops.

6. An integrated circuit with low-power built-in self-test logic, the integrated circuit comprising:
   combinational logic; and
   means for loading a shift test pattern of data into a loading circuit without applying said data to the combinational logic of the integrated circuit, wherein the shift test pattern of data is configured to test the combinational logic for logical faults, the means for loading comprising:
      a shift register comprising a plurality of flip-flops, each flip-flop comprising a data input, a scan-in input, a scan enable input and a sequential output, wherein the loading circuit is operable to receive the shift test pattern of data bit-by-bit at the scan-in input of a first flip-flop of the plurality of flip-flops and to receive a series of shift pattern signals at the scan enable input of each flip-flop of the plurality of flip-flops; and
      a plurality of switching elements, each receiving a sequential output of one of the plurality of flip-flops, each switching element selectably coupling the received sequential output to one of the combinational logic and a scan-in input of a next of the plurality of flip-flops.

7. The integrated circuit of claim 6, further including:
   means for loading a capture test pattern of data into the combinational logic; and
   means for capturing a resulting logic test pattern of data from the combinational logic in response to applying the loaded shift test pattern of data to the combinational logic.

8. The integrated circuit of claim 7, further including:
   means to operate in a TEST mode, wherein the TEST mode includes a SHIFT mode and a CAPTURE mode for the means for loading,
   wherein the means for loading a shift test pattern of data into the loading circuit includes means for loading the shift test pattern of data into the loading circuit in the SHIFT mode without passing power to the combinational logic,
   wherein the loading circuit include means for passing a sequential output of each flip-flop to the combinational logic in the CAPTURE mode, and
   wherein the CAPTURE mode is initiated when the shift test pattern of data is fully loaded into the loading circuit.

9. The integrated circuit of claim 8, further including a plurality of switching elements within the loading circuit, wherein the plurality of switching elements is in signal communication with the plurality of flip-flops and the combinational logic.

10. The integrated circuit of claim 9, wherein the plurality of switching elements includes:
    means for passing a sequential output of each flip-flop to a scan-in input of another flip-flop while not passing power to the combinational logic in the SHIFT mode, and
    means for passing the sequential output of each flip-flop to the combinational logic in the CAPTURE mode.

* * * * *

UNITED STATES PATENT AND TRADEMARK OFFICE
CERTIFICATE OF CORRECTION

PATENT NO. : 7,895,491 B2  Page 1 of 1
APPLICATION NO. : 11/418588
DATED : February 22, 2011
INVENTOR(S) : Yuqian C. Wong It is certified that error appears in the above-identified patent and that said Letters Patent is hereby corrected as shown below:

At column 9, line 46, "loading" should read --load--.
At column 10, line 47, "include" should read --includes--.

Signed and Sealed this
Nineteenth Day of April, 2011

David J. Kappos
*Director of the United States Patent and Trademark Office*